United States Patent [19]

Graham

[11] 4,267,509
[45] May 12, 1981

[54] MAGNETO-OPTICAL COLLOIDAL CELL AND DEVICE

[76] Inventor: W. Gordon Graham, 19133 Pala Mesa Pl., Northridge, Calif. 91326

[21] Appl. No.: 956,565

[22] Filed: Nov. 1, 1978

[51] Int. Cl.³ .................... G01R 33/02; G01R 33/00; G01N 21/00
[52] U.S. Cl. .................................. 324/244; 324/260; 356/338
[58] Field of Search ............... 324/96, 214, 244, 260; 356/336-343

[56] References Cited

U.S. PATENT DOCUMENTS

| | | | |
|---|---|---|---|
| 2,906,945 | 9/1959 | Weiss | 324/251 |
| 2,946,955 | 7/1960 | Kuht | 324/251 |
| 3,239,753 | 3/1966 | Arnold | 324/214 |
| 3,353,097 | 11/1967 | Johnson | 324/244 |
| 3,397,348 | 8/1968 | Hoeppel | 324/244 |
| 3,443,214 | 5/1969 | Meseruey | 324/214 |
| 3,769,584 | 10/1973 | Iten et al. | 324/96 |
| 4,064,453 | 12/1977 | Haas et al. | 324/244 |
| 4,147,979 | 4/1979 | Bayes et al. | 324/244 |

Primary Examiner—Gerard R. Strecker
Assistant Examiner—Walter E. Snow
Attorney, Agent, or Firm—Cislo & O'Reilly

[57] ABSTRACT

A magneto-optical device which is responsive to magnetic fields by means of a Tyndall Effect in a particular direction exhibited by aligned magnetic colloidal particles suspended in an illuminated liquid medium. The liquid medium is contained in a transparent vessel and has magnetic particles in a very low density, such that the liquid is substantially transparent to the naked eye. A light source is positioned to illuminate the liquid medium and a light-sensing device or photocell is positioned to receive light scattered by the magnetic particles. The light-sensing device is positioned at a predetermined angle from the paraxial direction of the light source. All colloidal solutions, when illuminated by a beam of light, exhibit the Tyndall Effect, i.e. a visible scattering of light by the colloidal particles. When the magnetic colloidal solution of this device is brought into the presence of a magnetic field, the magnetic particles become aligned, causing the directed scattering of light called herein the Directional Tyndall Effect, which scattering can be detected by the photocell. In order to minimize the effects of surrounding light, the vessel containing the liquid medium can be enclosed in an opaque container with the photocell and light source mounted in appropriate apertures. For use in varying applications, two photocells can be provided, with the photocells and light source in an orthogonal arrangement.

30 Claims, 13 Drawing Figures

MAGNETO-OPTICAL COLLOIDAL CELL AND DEVICE

BACKGROUND OF THE INVENTION

This invention relates generally to colloidal solutions having magnetic particles and uses therefor, and more particularly relates to magneto-optical devices employing the colloidal solution.

Colloidal solutions having magnetic particles sometimes referred to as Ferrofluids are known in the art and are used for many purposes, such as the detection of magnetic fields. Devices responsive to magnetic fields measuring the direction and various values of the magnetic fields are called magnetometers. They come in many forms and among them are devices employing these ferrofluids or colloidal suspensions having magnetic particles.

One such device uses a very dense colloidal suspension having magnetic particles to detect magnetic fields from the orientation of the particles in the liquid medium caused by the magnetic field. The suspension is illuminated by a light source and affected by a magnetic field. Light passing through the solution is detected by a photocell directly in line with the light source, thus providing an indication of the influence caused by the magnetic field. In this device the suspended particles have a shutter or "venetian blind" effect to either allow light to pass through when the magnetic field is of a particular orientation with respect to the direction of the light source or to prevent light from passing through the cell when the magnetic field is at some other angle, such as perpendicular to the direction of the light source. The sensitivity and response time of this device is not optimal because of the greater concentration and viscosity of the magnetic colloidal suspension used therein.

Another device utilizing the effect of magnetic fields on ferrofluids is used to produce light polarization. A magnetic field applied to a suspension of ferrite particles causes orientation of the particles in a liquid medium to form in elongated, lineshaped conglomerates, which polarize incident light passing through the magnetized suspension.

The effect of an electrostatic field on a colloidal suspension consisting of non-magnetic particles is also employed for other purposes. One such device is used for particulate analysis of an air sample. In this device airborne particles are illuminated and subjected to an electrostatic field. Scattered light is detected by a photocell to provide an analysis of the particles suspended in the airborne sample.

However, none of the above devices teaches nor discusses use or adaptability of the effect of magnetic fields on a colloidal solution of magnetic particles for the visualization, detection and measurement of magnetic fields by means of the Tyndall Effect in a particular direction hereinafter called the Directional Tyndall Effect.

SUMMARY OF THE INVENTION

The purpose of the present invention is to provide a magneto-optical device which takes advantage of the Tyndall Effect to detect, monitor, measure and utilize the effects of magnetic fields.

This device provides a transparent vessel or container having a colloidal solution in which a plurality of magnetic particles are suspended. These are also known as ferrofluids; but in the case of the magneto-optical device of this invention, they are in extremely diluted form such that they are substantially transparent to the naked eye. The transparent vessel has a light source mounted at some convenient location for illuminating the fluid and a photocell positioned at an angle to the axis of the light source. The light source may be collimated in any convenient and suitable fashion. With the transparent vessel or cell illuminated by a light source, and a photocell at a 90° angle to the axis of the light source, the colloidal solution will exhibit a scattering of light called The Tyndall Effect. In the presence of a magnetic field, this scattering of light will be highly directional due to the alignment of the irregularly shaped magnetic colloidal particles. When the magnetic field, light source and photocell are in an orthogonal or right-angled orientation, the scattered light detected by the photocell will be at a maximum. By using two photocells, positioned on different axes, variations in the measurement of scattered light can easily be detected and utilized.

The device can be made into a useful magneto-optical apparatus by covering the transparent cell with an opaque container and employing apertures for the light sources and the photocells. Artificial magnetic fields can be created by coils positioned at various locations to the transparent vessel or utilizing permanent magnets. With these devices the magneto-optical apparatus can be utilized to respond to electrical current or measure, visualize and detect magnetic fields. The device also can be employed as a circuit element in a magnetometer or other electrical apparatus.

A convenient name for the magneto-optical device hereinafter described is a Magnetic Colloidal Cell (MCC) which, as the name implies, consists of a transparent vessel, preferably of glass, filled with a colloidal suspension of magnetic particles which are preferably ferromagnetic or ferrimagnetic material in a liquid medium. The colloidal suspension is in diluted form to be substantially transparent so that when it is illuminated by a beam or source of light, it may efficiently exhibit the Tyndall Effect characteristic of a colloidal solution. The Tyndall Effect is the result of incident light being scattered by sub-microscopic colloidal particles.

This is also known as or referred to as the so-called Rayleigh Scattering. Rayleigh scattering of light by a small particle is greatest when the longest dimension of the particle is parallel to the electric vector of the incident light. Furthermore, the most intense scattering takes place in a direction which is perpendicular to both the long axis of the scattering particles and to the direction of the incident light. That is, the direction of maximum scattering, the longest axis of the scattering particles, and the direction of the incident light are orthogonal. It is pointed out here that the electric vector is at all times perpendicular to the direction of the incident light. Furthermore, in the direction of maximum scattering the scattered light is strongly plane polarized. This feature of the magneto-optical apparatus or device can be very useful and will be described in more detail hereinafter.

The magnetic colloidal particles used in the colloidal solution are preferably quite irregular in shape and have at least one long axis which will align itself parallel to any existing magnetic field. That is, each magnetic colloidal particle is a small magnetic dipole that tends to align itself with the magnetic lines of force in its own region. When the colloidal particles are aligned in this configuration, they produce a Tyndall Effect whose intensity and direction are directly dependent upon the strength and direction of a magnetic field in the proximity of the device.

In very weak fields only a small number or amount of the particles will align themselves with the magnetic field which will generally be enough to effectively "cancel" or "null" the local field within the cell. As a magnetic field in the proximity of the device increases, ultimately all of the magnetic colloidal particles will become aligned with the fields, resulting in a "saturated" condition. That is, any further increase in the magnetic field will not result in any increased particle alignment. Since the intensity of the Tyndall Effect in a particular direction is proportional to the number of aligned colloidal particles, the Tyndall Effect will likewise saturate at some magnetic field strength. However, the Tyndall Effect will saturate somewhere between the range of 0 and maximum, and the intensity will be directly related to the intensity of the magnetic field, thus allowing the detection and measurement of a magnetic field by visual, optical, photographic, or photoelectric means. That is, by some means sensing the intensity and direction of the scattered light the intensity and direction of a magnetic field can be visualized and measured.

The magneto-optical device described above can therefore be defined briefly as a device which visualizes, detects, monitors or measures the intensity, direction and shape of a magnetic field by means of the intensity and direction of the Tyndall Effect exhibited by the aligned magnetic colloidal particles suspended in a liquid medium contained in a transparent vessel illuminated by a light source.

It is therefore one object of the present invention to provide a magneto-optical device which detects magnetic fields by detecting the light scattered by aligned magnetic colloidal particles.

Another object of the present invention is to provide a magneto-optical device employing a colloidal solution of magnetic particles which exhibits the Directional Tyndall Effect.

Still another object of the present invention is to provide a magneto-optical device employing a colloidal solution of magnetic particles which can be used as a circuit element.

Still another object of the present invention is to provide a magneto-optical device employing a colloidal solution of magnetic particles which can respond to and detect the magnetic fields produced by an electric current and thereby provide a method of detecting and measuring said electric currents.

Yet another object of the present invention is to provide a magneto-optical device employing a colloidal solution of magnetic particles for use in a magnetometer.

Yet another object of the present invention is to provide a magneto-optical device employing a colloidal solution of magnetic particles which can measure a differential in the light scattered in various directions by the aligned magnetic particles in a magnetic field.

DETAILED DESCRIPTION OF THE PREFERRED EMBODIMENT

The principle of the present invention is to provide a magneto-optical device which utilizes the Tyndall Effect to provide very sensitive means for visualizing, detecting, and measuring magnetic fields which can be applied to a number of uses. In the figures, with the exception of FIGS. 9, 10 and 11, various configurations are illustrated to demonstrate the principles of the invention and the following conventions have been adopted.

1. The magnetic field (B) is shown as directed parallel to the positive X axis in a direction away from the origin.

2. The axis of the incident light from the light source is illustrated as parallel to the positive Y axis in a direction away from the origin.

With the above two conventions, the direction of maximum scattered light by magnetic colloidal particles aligned in a magnetic field will always be at a maximum in a direction parallel to the Z axis. The scattering takes place in both directions, that is, positive and negative, parallel to the Z axis directed both toward and away from the origin. However, for the sake of clarity, the drawings have the axes illustrated and only the light scattered along the positive Z axis away from the origin is shown.

Figure 1:
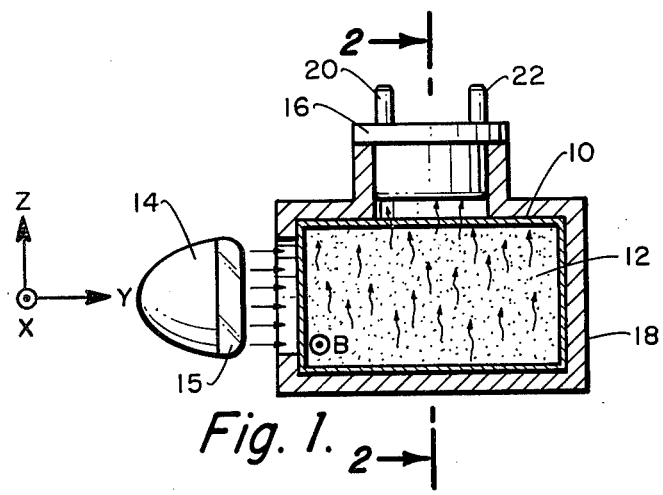
FIG. 1 is a cross-sectional view of a magneto-optical device according to the invention employing a colloidal solution having magnetic particles.

In FIG. 1 there is shown a transparent vessel 10 having therein a liquid medium 12 having a plurality of magnetic particles. These solutions are of various kinds and are sometimes called ferrofluids. Suitable colloidal suspensions can be of iron, nickel, or magnetic iron oxide in various oils, hydrocarbons, fluorocarbons, ketones, etc. However, it is preferable to employ a very diluted suspension of a ferromagnetic material obtained by greatly diluting a ferrofluid. These fluids are available commercially and are stabilized colloidal suspensions of ferromagnetic material.

Figure 2:
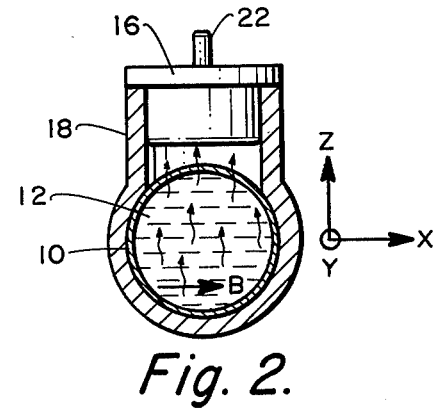
FIG. 2 is a sectional view of the magneto-optical device of FIG. 1, taken at 2—2.

A light source 14, which may or may not be collimated in some fashion, is positioned adjacent to the transparent vessel or cell 10. At some position offset from the axis of the light source 14, a photocell 16 is positioned and supported. In order to minimize the effects of outside incident light, an opaque container 18 can be provided to enclose the transparent vessel or cell 10. Of course, an alternative construction would be to provide an opaque container with transparent windows for enclosing the colloidal solution 12. Suitable electronic circuit means (not shown) can be readily connected to the electrodes 20 and 22 of the photocell 16 for measuring the intensity of scattered light detected. In FIGS. 1 and 2 the magnetic field is shown at B and the direction of scattered light perpendicular to the magnetic field (B) is shown by the arrows. While particles are illustrated in the drawings for purposes of describing the principles of the operation, in actual practice, the colloidal solution 12 will appear substantially transparent to the naked eye. Thus, the size, density and number of magnetic particles can be chosen to produce a very sensitive instrument. The particle size is not critical to the operation of the device so long as the particles are substantially smaller than the wavelength of the incident light. This is necessary to obtain true Rayleigh scattering. Larger particles would reflect light rather than scatter it and would not produce the Tyndall Effect. Optimum size of the particles would depend upon the characteristics required in a particular application with such parameters as sensitivity, response time, saturation level, etc., dependent upon size and concentration of the suspended magnetic particles, but in general a particle size between 1000 angstroms and 50 angstroms would be suitable for most applications where the incident light is in the visible range of the spectrum. Of greater importance is the stability of the colloidal solution. Larger particles are more likely to settle out and from this standpoint a particle size of 100 angstroms or smaller is desirable.

The magnetic colloidal cell operates most efficiently when the concentration of magnetic colloidal particles is in the range of $5 \times 10^8$ to $5 \times 10^{12}$ particles per cubic centimeter, with a preferred concentration in the range of $5 \times 10^9$ to $5 \times 10^{11}$ particles per cubic centimeter. With concentrations greater than $5 \times 10^{12}$ particles per cubic centimeter, excessive multiple scattering takes place and the directional Tyndall Effect is not as well defined. With concentrations less than $5 \times 10^8$ particles per cubic centimeter, there are too few particles for adequate scattering to take place and the Directional Tyndall Effect, although sharply defined, is at a very low level of light intensity which makes detection and measurement more difficult.

Figure 3:
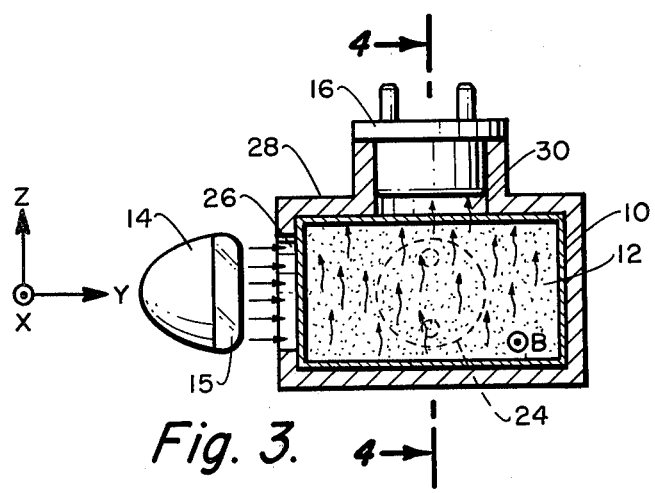
FIG. 3 is a cross-sectional view of a magneto-optical device utilizing a colloidal solution having magnetic particles for detecting very weak magnetic fields by differential measurements.
Figure 4:
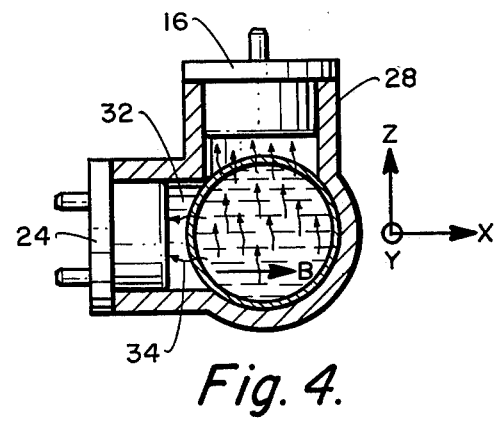
FIG. 4 is a sectional view of the magneto-optical device of FIG. 3 taken at 4—4.

The magneto-optical device illustrated in FIGS. 3 and 4 is a variation of that shown in FIGS. 1 and 2, with the addition of a second light-sensing device or photo detector 24. As before, the light source 14 illuminates the magnetic colloidal solution 12 in the transparent cell or vessel 10 through the aperture 26 in a suitable opaque enclosure 28. In this figure, incident light or scattered light is again illustrated by the arrows and the magnetic field by the symbol B. In this embodiment the enclosure 28 would have apertures or windows at 26, 30 and 32 for an orthogonal arrangement of the photocells or light-sensitive devices 16, 24 in relationship to the light source or illumination 14. The perpendicular arrangement of the photocells 16 and 24 enhances the sensitivity allowing detection and measurement of very weak magnetic fields. The greater sensitivity of this device is due to the fact that it is a differential device. That is, with the magnetic field along the X axis as shown, the photocell 16 would indicate a maximum detection of scattered light, while the photocell 24 would indicate a minimum of scattered light (indicated by single arrow 34). Again, the photocells 16 and 24 would be connected to suitable electronic circuitry to measure and compare the differential in scattered light detected by the photodetectors.

Obviously, the photocells or light-sensitive devices could be a variety of devices, such as visual, optical, photographic, as well as photo-electric means. The magnetic colloidal particles align themselves in the direction of the magnetic field, B, i.e. parallel to the X axis. The illumination from the light source 14 which may be collimated by the lens 15 will be scattered preferentially along the Z axis by the aligned magnetic colloidal particles. This scattering of light along the Z axis is strongly plane polarized and will be referred to hereinafter as "The Directional Tyndall Effect". The photocell or light-sensitive device 16 located with its axis parallel to the Z axis can sense this very bright scattering of light; whereas, the photocell or light-sensitive device 24 positioned with its axis parallel to the magnetic field can sense only a very weak scattering of light.

Insertion of a polarizing filter (not shown) between the light source and the colloidal cell 10 with its axis parallel to the X axis will cause all of the incident light to be plane polarized in the direction of the X axis. This will reduce X axis scattering still further while having essentially little effect upon the Z axis scattering. Thus, even a weak magnetic field along the X axis will result in a very large difference in the intensity of light scattered along the Z axis as compared with that scattered along the X axis or other intermediate directions. The direction of maximum scattering, the direction of incident light from light source 14, and the direction of the magnetic field are always orthogonal in the magneto-optical magnetic colloidal cell.

In the embodiment shown in FIGS. 1 through 4, the transparent vessel or colloidal cell 10 is preferably a cylindrical element as can be seen from the sectional views of FIGS. 2 and 4. Also, the opaque enclosure can be any suitable design to effectively limit rays entering the vessel to those from the light source 14 and also effectively limit the rays entering the vessel 10 to those that may be considered paraxial. The opaque enclosure with the apertures for the light-sensing devices also prevents direct (unscattered) light from entering the photocells which may be any type of photoconductive cells, photodiodes, photo transistors or other photo-electric devices.

The embodiment utilizing two light-sensitive devices, as illustrated in FIGS. 3 and 4, is basically a differential device with one photocell receiving a maximum amount of scattered light, while the other photocell is receiving a minimum. With the magnetic field B at some intermediate angle theta ($\theta$), both photocells receive some scattered light and the output signal of the photocell may be fed into a differential amplifier (not shown) or if the photocells are photoconductor cells, they may be used as arms of a Wheatstone bridge to get a differential reading. This embodiment also permits simultaneous measurement of Y and Z components of a magnetic field B, such that when theta ($\theta$) equals 45°, the output of the two photocells 16 and 24 would be equal.

Figure 5:
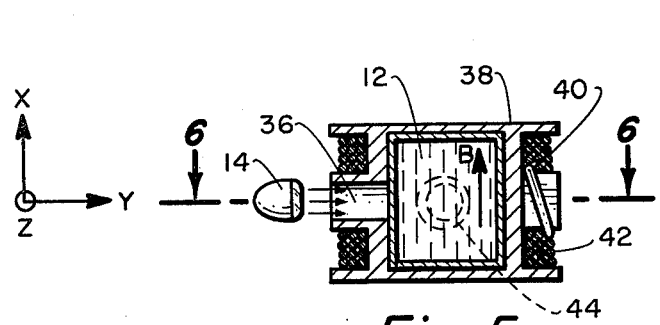
FIG. 5 is a sectional view of a magneto-optical device employing the principles of the invention for responding to artificially applied magnetic fields for detection and amplification of small currents.
Figure 6:
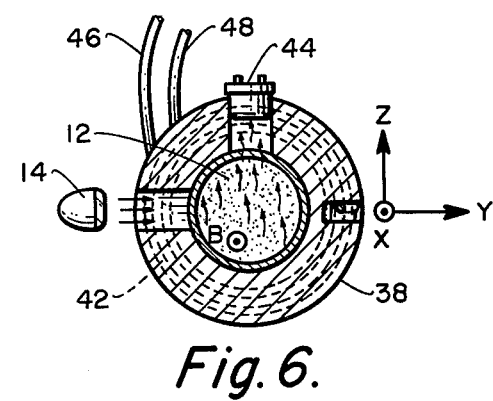
FIG. 6 is a sectional view taken at 6—6 of FIG. 5.

The embodiment shown in FIGS. 5 and 6 illustrates the principle of the invention applied for use as a circuit element for the detection and amplification of small currents. As in previous embodiments, there would be a light source 14 illuminating a magnetic colloidal solution 12 through an aperture 36 in a housing 38. The housing also has two coils 40 and 42 which are continuous with each other but are separated by a distance equal to their radius. Thus they form Helmholtz coils and the magnetic field in the region between them would therefore be uniform. The coils 40 and 42 may be used with or without ferrite cores. However, with ferrite cores the magnetic field in the region between the coils will be much stronger, thus permitting detection of smaller currents. A disadvantage of the use of ferrite cores, however, is that the field would be less uniform, thus requiring very careful calibration.

The light source illuminates the colloidal solution 12 with a current through the coils 40 and 42 producing a magnetic field illustrated at B. The magnetic field will align the magnetic particles in the colloidal solution 72 creating a scattering of light or Directional Tyndall Effect which can be detected by a photocell 44. The difference in the intensity of scattered light received by the photocell 44 is dependent upon the strength of the magnetic field B which is dependent upon the magnitude of the current flowing through the coils 40 and 42. Thus the principle of the invention employed in this embodiment can be very useful as a detector and amplifier of small currents. If a small current source is connected across coil leads 46 and 48, the magnetic field B would be produced along the X axis, either in the direction shown or at 180° to this direction, depending upon the polarity of the current source connected across the leads 46 and 48. This orients the particles in the colloidal solution 12 which scatter light illustrated by the arrows in FIG. 6, which can be detected by a photo detector or light-sensitive device 44.

Figure 7:
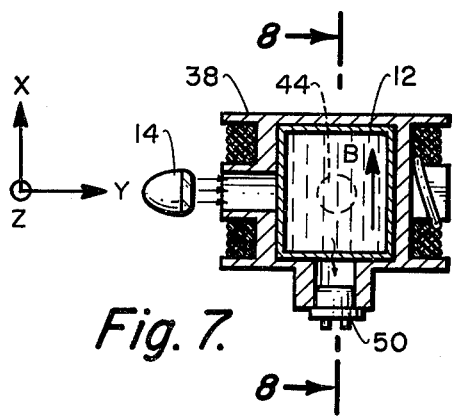
FIG. 7 is a variation of the magneto-optical device of FIG. 6 for measuring and detecting very small currents.
Figure 8:
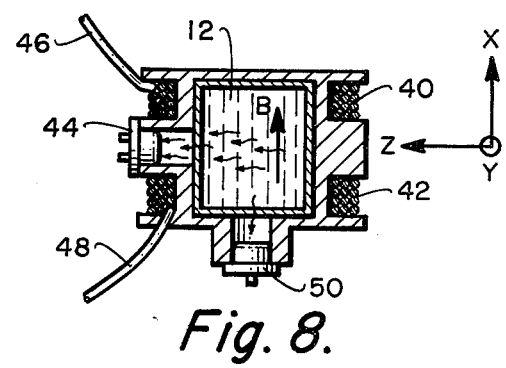
FIG. 8 is a sectional view of the magneto-optical device of FIG. 7 taken at 8—8.

A variation of the device illustrated in FIGS. 5 and 6 is shown in FIGS. 7 and 8 with two photocells being employed instead of one. If a small current source is connected across the coil leads 46 and 48, a magnetic field B is again produced along the X axis, either in the direction shown or at 180° to this direction depending upon the polarity of the current source connected across the leads 46 and 48. The magnetic field B again orients the magnetic colloidal particles in the solution 12 so that they lie with their long axes parallel to the X axis, thus producing maximum scattering of light along the Z axis. The difference in the intensity of scattered light received by the two photocells is dependent upon the strength of the magnetic field B and is thus dependent upon the magnitude of the current flowing through the two coils 40, 42.

This embodiment is intended for the measurement of extremely small currents and can be useful as a circuit component as can the non-differential counterpart of the device illustrated in FIGS. 5 and 6. This embodiment is also very useful as a detector of small currents and if the two photocells 44 and 50 are photoconductive type, each cell can be one arm of a Wheatstone bridge to produce a very sensitive current-detecting or "null" device. Ideally this embodiment of the invention should be used in a space free of magnetic fields, such as in the center of a system of Helmholtz coils. This is not always practical, however. So, as an alternative it is preferable to orient the device so that the earth's magnetic field is at an intermediate angle to the two photocells, thus directing an equal amount of scattered light toward each. In this way the system can be balanced or nulled magnetically and photoelectrically before a current measurement is taken. When used with only a single photocell, as in FIG. 5 and 6, this balancing does not need to be taken into consideration, but the device is somewhat less sensitive than when used with the two photocells. Again, as before, the coils could be wound around cores of material of high permeability such as ferrite in order to increase the magnetic field B produced by the current flowing through these coils.

Figure 9:
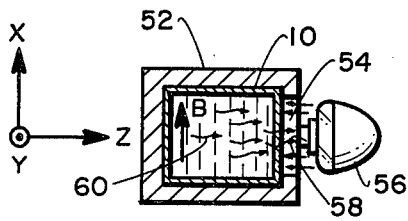
FIGS. 9 through 11 are cross-sectional views illustrating the principles of the invention in which the magneto-optical device detects back-scattered light for magnetic fields in various directions.
Figure 10:
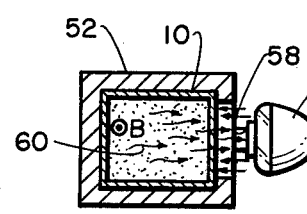
Figure 11:
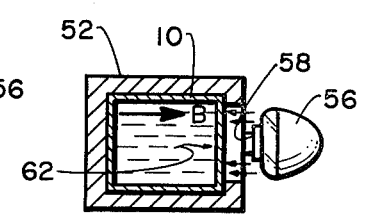

FIGS. 9 through 11 are a series of sectional views or drawings illustrating the invention in an embodiment which can utilize back-scattering of light. That is, light which is scattered back toward its source by the aligned magnetic colloidal particles. These configurations demonstrate the ability to place photodetectors at any angular position with respect to the light source except directly in front and on the axis (paraxial) in contrast to some prior art devices. In all of these three views, the colloidal cell 10 is again enclosed by an opaque enclosure 52 with a single aperture 54 for illumination by a light soruce 56 surrounding or positioned adjacent to a light-sensitive or sensing device 58. In all three of these drawings the light is directed along the Z axis toward the origin and the light-sensing device 58 or photocell also looks along the Z axis toward the origin. In FIG. 9 a magnetic field directed along the positive X axis will produce a scattering of light by the Directional Tyndall Effect as shown by the arrows 60. In FIG. 10 the magnetic field B isdirected along the positive Y axis. In both FIGS. 9 and 10, the back-scattered light which reaches to the photocell 58 is at a maximum, thus a magnetic field anywhere in the X-Y plane will produce a maximum of scattered light detected by the photocell 58.

In FIG. 11 the same device is illustrated with the magnetic field B directed along the Z axis parallel to the incident light. In this position the aligned magnetic colloidal particles scatter very little light and so the photocell registers a very sharp minimum, as illustrated by the single arrow 62. This can be a useful and very sensitive way of measuring the exact direction of the magnetic field B.

Figure 12:
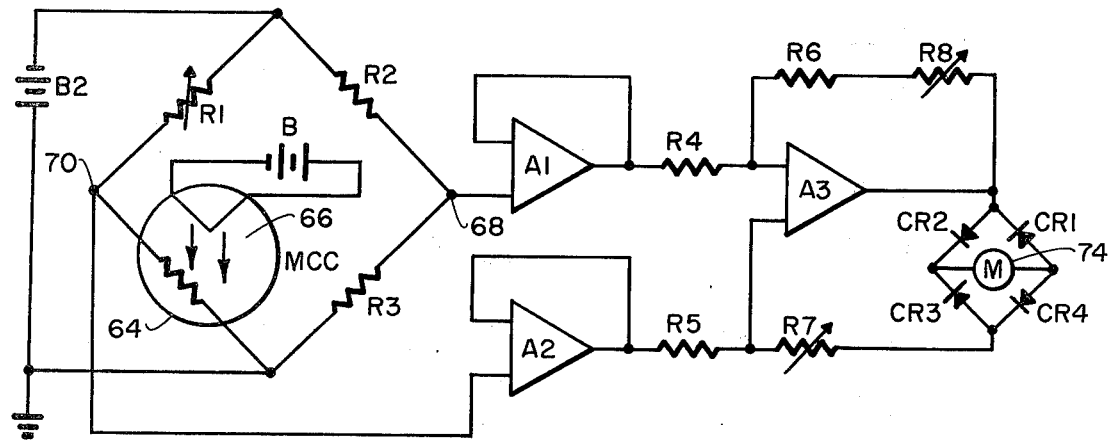
FIG. 12 illustrates one application of the magneto-optical device employing the principles of the invention as the detector in a magnetometer.

The schematic diagram illustrated in FIG. 12 illustrates the principle of the invention and a magnetic colloidal cell, similar to that shown in FIGS. 1 and 2, employed as a sensor of a magnetometer for magnetic field detection and measuring. In the schematic diagram the magneto-optical device 64 is labelled MCC and forms one leg or arm of a resistance or Wheatstone bridge. The resistor R1 provides a method of balancing the Wheatstone bridge before taking any measurements. The opposite arms of the Wheatstone bridge have fixed resistances R2 and R3.

The illumination of the magnetic colloidal cell 64 is illustrated by the arrows 66. The Wheatstone bridge, formed by the magnetic colloidal cell 64, the resistors R1, R2 and R3, is connected to a source or battery B2 and the output terminals 68 and 70 are connected to amplifiers A1 and A2. The output of the amplifiers is then connected to operational amplifier A3, which provides an output indicating a variation in magnetic field strength which is rectified by the diode bridge rectifier and detected by an analog current or volt meter 74 or other analog instrument or device.

With this type of configuration, the magnetic colloidal cell can detect a variation in magnetic field strength amounting to only a very small fraction of the earth's field, which makes it very suitable for geophysical prospecting to detect and measure magnetic anomalies associated with veins and ore bodies. With the addition of a spirit level and a protractor (not shown) to the instrument case, the instrument can be oriented to a position of maximum magnetic flux reading, at which point the magnetic dip could be read off the protractor by returning the spirit level to a level position while at the same time being able to read the magnitude of the magnetic field strength from the meter 74. The meter should preferably be a digital current or volt meter to avoid spurious magnetic fields associated with galvanometers, but in this case a linearizing circuit would be added between the amplifier output and the digital meter. Advantages of this type of instrument would be its rugged construction, short time constant, low cost, great sensitivity and high portability.

Numerous applications of the invention are possible in view of the high sensitivity, high reliability and rapid response. By utilizing any source to create the magnetic field in the colloidal cell or vessel, the output can be measured and used for a number of purposes. For example, as was described previously, various embodiments can be constructed for use as small current detectors as well as differential small current comparators.

The device could also be adapted (using additional circuitry) for use as an audible electronic compass with the magnetic field being detected as some deviation from a preset direction which can result in production of an audible sound varying in tone when a person deviates from the aligned or selected direction. Change in frequency would indicate the deviation from a particular path which would allow the device to be used to permit military navigation in total darkness or to follow a course without the necessity of watching a compass.

Figure 13:
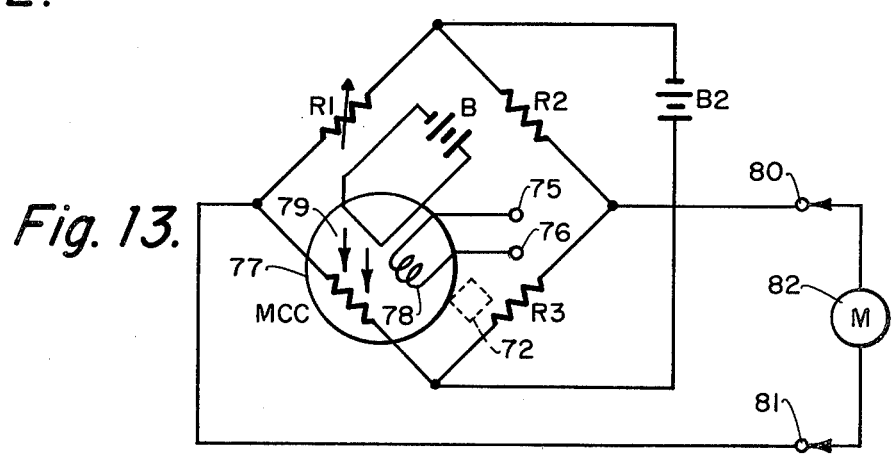
FIG. 13 illustrates one application of the magneto-optical device employing the principles of the invention as a circuit element capable of detecting and amplifying small electric currents.

The device could also be used as a circuit element to construct an "optical amplifier" which could be used (among other possibilities) as a small current meter. This application of the invention is illustrated in FIG. 13 which is a schematic diagram of a small current detector and/or amplifier utilizing the embodiment of the invention illustrated in FIGS. 5 and 6 as a circuit element.

In the schematic diagram the magneto-optical device 77 including a coil 78 is labelled MCC and forms one arm of a Wheatstone bridge. The resistor R1 provides a method of balancing the Wheatstone bridge before taking any measurements. The opposite arms of the Wheatstone bridge have fixed resistances R2 and R3.

The illumination of the magnetic colloidal cell 77 is illustrated by the arrows 79. The Wheatstone bridge formed by the magnetic colloidal cell 77, the resistors R1 R2 and R3 is connected to a source or battery B2 and the output terminals 80 and 81 may be connected to a galvanometer 82 (or to an amplifier, if further amplification is desired).

A small current source connected to the input leads 75 and 76 of the coil 78 produces a magnetic field in the magnetic colloidal cell 77 which in turn produces a Directional Tyndall Effect which is detected by the photo-conductive cell in the magnetic colloidal cell and thus produces an imbalance in the Wheatstone bridge resulting in a much larger current flowing through the galvanometer 82.

By employing a permanent magnet 72, shown dotted in the schematic diagram of FIG. 13, various modifications can be effected to increase or decrease the sensitivity. The closer the permanent magnet to the magnetic colloidal cell 77, the more highly aligned would be the particles and therefore a greater magnetic field would be required to change their orientation, thus resulting in a smaller response, i.e. weaker Directional Tyndall Effect for the same magnitude of the magnetic field. In the embodiment shown the magnet would be adjustably mounted proximate the cell 77.

Numerous other applications of the basic invention and various instruments for using the invention are conceivable. Various colloidal suspensions, as indicated previously, are also possible but ideally a stabilized colloidal suspension of ferromagnetic material in very diluted form is preferred. These devices and instruments indicated are intended only as an indication of a wide variety of uses to which the basic invention and principles can be put. The principles of the invention and its many embodiments can be used in countless devices whose function depends upon the ability to detect and measure the magnitude and/or direction of the magnetic fields or the magnitude and/or direction of infinitisimal electric currents. It is suitable for use as a circuit component where unique isolation and amplification properties make it of great value. Unlike existing opto-isolators, there is no minimum threshold of voltage required to produce a transfer of signal. It is an improvement on existing devices for magnetic field measurement and detection because it is inexpensive, sensitive, small, rugged and has a very short time constant, and is extremely versatile. Its complete lack of hysteresis and its internal amplifying properties make it useful in many applications where other devices will not suffice. It can be used to great advantage wherever it is required that a small change in magnetic field must control a large current because in the proper configuration, it can perform this task without intermediate amplification.

Obviously, many modifications and variations of the present invention are possible in light of the above teachings. It is therefore to be understood that the full scope of the invention is not limited to the details disclosed herein but may be practiced otherwise than as specifically described.

What is claimed is:

1. A magneto-optical apparatus comprising:
a container having at least portions transparent;
a transparent liquid medium in said container;
a plurality of magnetic particles suspended in said liquid medium thereby forming a substantially transparent colloidal solution;
a light source positioned to illuminate said colloidal solution;
said magnetic particles in said colloidal solution adapted to produce a directional scattering of light under the influence of a magnetic field;
light-sensing means positioned at a predetermined angle with respect to the central axis of said light source;
said directional scattering of light produced by said magnetic particles being toward said light-sensing means;
whereby said light-sensing means senses variations in intensity of scattered light from said magnetic particles caused by the magnetic field.

2. The apparatus according to claim 1 including means for indicating the variations in intensity of light detected by said light-sensing means.

3. The apparatus according to claim 2 wherein said indicating means comprises a galvanometer.

4. The apparatus according to claim 1 wherein said magnetic particles are irregular in shape.

5. The apparatus according to claim 4 wherein said irregular particles have one long axis.

6. The apparatus according to claim 1 wherein said substantially transparent colloidal solution is a stabilized colloidal suspension of ferromagnetic material.

7. The apparatus according to claim 1 wherein said substantially transparent colloidal solution is a stabilized colloidal suspension of ferrimagnetic material.

8. The apparatus according to claim 1 wherein the magnetic particles' size is less than the wave length of the incident light.

9. The apparatus according to claim 1 wherein the particle size is between approximately 1000 Angstroms and 50 Angstroms.

10. The apparatus according to claim 1 wherein the concentration of magnetic particles in the liquid medium is less than about $5 \times 10^{12}$ particles per cubic centimeter.

11. The apparatus according to claim 1 wherein the concentration of magnetic particles is in the range of about $5 \times 10^9$ to $5 \times 10^{11}$ particles per cubic centimeter.

12. The apparatus according to claim 1 wherein said container comprises:
a transparent vessel;
an opaque cover over said transparent vessel; and
a plurality of openings in said opaque cover providing access to said transparent vessel.

13. The apparatus according to claim 12 wherein there are two openings in said opaque cover;
said light source being positioned adjacent to one of said openings; and
said light-sensing means being positioned adjacent to said second opening.

14. The apparatus according to claim 12 wherein said light-sensing means is positioned substantially perpendicular to said light source.

15. The apparatus according to claim 13 including:
a third opening in said opaque cover;
second light-sensing means positioned adjacent said third opening; and
said second light-sensing means is at a predetermined angle with respect to said light source and said first light-sensing means.

16. The apparatus according to claim 15 wherein the respective positions of said light source and said first and second light-sensing means are orthogonal.

17. The apparatus according to claim 14, including:
a pair of coils at each end of said container connected to amplifying means whereby said magneto-optical apparatus can detect and amplify small currents.

18. The apparatus according to claim 17 wherein said coils have ferrite cores.

19. The apparatus according to claim 17 wherein the respective positions of said light source and said first and second light-sensing means are orthogonal.

20. The apparatus according to claim 19 wherein said coils have ferrite cores.

21. The apparatus according to claim 17 wherein said coils are positioned to produce a uniform magnetic field.

22. The apparatus according to claim 17 including:
sensitivity adjusting means for adjusting the sensitivity of said magnetic particles to a magnetic field.

23. The apparatus according to claim 22 wherein said sensitivity adjusting means comprises a permanent magnet positioned proximate said colloidal solution.

24. The apparatus according to claim 23 including means for varying the position of said permanent magnet with respect to said colloidal solution whereby the sensitivity of said magnetic particles may be varied.

25. A magnetometer comprising:
a resistance bridge circuit having a balancing resistor in one leg and a device as in claim 1 in another leg;
a pair of operational amplifiers parallel connected to the outputs of said resistive bridge;
a differential amplifier connected to the outputs of the operational amplifiers;
rectifying means for rectifying the output of said differential amplifier; and
indicating means for indicating the output of said rectifying means.

26. The magnetometer according to claim 25 wherein said indicating means is a digital current meter.

27. The magnetometer according to claim 25 wherein said indicating means is a digital voltmeter.

28. An optical amplifier comprising:
a resistance bridge circuit having a balancing resistor in one leg and a device as in claim 1 in another leg;
at least one coil positioned proximate said magneto-optical device for applying an electro-magnetic field; and
a galvanometer connected across the resistance bridge for measuring the effect of the electro-magnetic field.

29. The optical amplifier according to claim 28 including:
modifying means for modifying the effect of the electro-magnetic field by aligning the magnetic particles whereby the sensitivity is increased or decreased.

30. The optical amplifier according to claim 29 wherein said modifying means comprises:
a permanent magnet adjustably positioned proximate said magneto-optical device for increasing or decreasing the effect of the electro-magnetic field on the magnetic particles.

* * * * *